United States Patent [19]
Larson

[11] Patent Number: 4,896,121
[45] Date of Patent: Jan. 23, 1990

[54] CURRENT MIRROR FOR DEPLETION-MODE FIELD EFFECT TRANSISTOR TECHNOLOGY

[75] Inventor: Lawrence Larson, Santa Monica, Calif.

[73] Assignee: Hughes Aircraft Company, Los Angeles, Calif.

[21] Appl. No.: 264,410

[22] Filed: Oct. 31, 1988

[51] Int. Cl.$^4$ .............................................. H03F 3/16
[52] U.S. Cl. ..................................... 330/288; 330/277
[58] Field of Search ................ 323/315, 316; 330/277, 330/288, 300, 307

[56] References Cited
U.S. PATENT DOCUMENTS 3,953,807  4/1976  Schade, Jr. ..................... 330/307 X
4,525,682  6/1985  Lai et al. ............................. 330/288

Primary Examiner—Steven Mottola
Attorney, Agent, or Firm—P. M. Coble; W. K. Denson-Low

[57] ABSTRACT

A novel, precise current mirroring technique for depletion-mode field effect transistor technology uses a diode level-shifting circuit between the drain and the gate of a first depletion-mode Field Effect Transistor (FET) to keep its gate voltage below its drain voltage. The gate of the first depletion-mode FET is connected to the gate of a second depletion-mode FET. A current source is used to compensate for the current drawn by the level-shifting circuit. The current source preferably includes a FET and at least one Schottky diode.

13 Claims, 4 Drawing Sheets

CURRENT MIRROR FOR DEPLETION-MODE FIELD EFFECT TRANSISTOR TECHNOLOGY

BACKGROUND OF THE INVENTION

1. Field of the Invention

This invention relates to current mirrors, and more particulary to current mirrors for depletion-mode silicon or gallium arsenide (GaAs) field effect transistor (FET) circuits.

2. Description of the Related Art

A current mirror is a circuit in which the output current tracks the input current, and the output current is either equal to or a fixed multiple of the input current. A current mirror is a standard building-block in the design of analog circuits. It functions essentially as a current amplifier, with a low input impedance and a high output impedance.

Current mirrors are known for use with bipolar transistors and enhancement-mode Metal Oxide Semiconductor Field Effect Transistors (MOSFETs). However, these current mirrors cannot be used with depletion-mode gallium arsenide FET devices because standard current mirrors operate on the assumption that the transistor is in its active mode when its gate is connected to the drain of the transistor. This is true for enhancement-mode Field Effect Transistors (FETs), but is not true for gallium arsenide or other types of depletion-mode transistors. In a depletion-mode gallium arsenide or other type of depletion-mode Field Effect Transistor, the gate potential must be at a lower potential than that of the drain to be in the active mode.

All current mirrors work by forcing an input current through the drain of the transistor, and measuring the resulting gate potential. That gate potential is used to control the gate potential of another transistor to create an output current. There is no precise, known technique for forcing current through the drain of a depletion-mode FET and still keeping its gate potential lower than that of the drain. The standard current mirroring techniques are described in Sedra Adel S. et al, *Microelectronic Circuits*, (1982), Holt, Rinehart and Winston, San Francisco, pages 433–437.

A current mirror for depletion-mode gallium arsenide devices is desirable because of the advantages of GaAs over silicon in semiconductor devices. A gallium arsenide MESFET can switch about twice as much current as a silicon MESFET with a comparable geometry. Since the gate-source capacitances for gallium arsenide and silicon MESFETs are comparable, the gallium arsenide switch is about twice as fast as the silicon device.

Also, the turn-on and turn-off times are two to three times lower (faster) or gallium arsenide MESFETs than for comparable silicon MESFETs. See Nowogrodzki, M. (editor), *Advanced III-V Semiconductor Materials Technology Assessment* (1984), Noyes Publications, Park Ridge, N.J., pages 95–113. A good introduction to gallium arsenide technology is Ferry, David K., *Gallium Arsenide Technology* (1985), Howard W. Sams and Company, Inc., Indianapolis.

A basic current mirror using enhancement-mode MOSFET devices is shown in FIG. 1. In FIG. 1 an enhancement-mode MOSFET T1 has its drain connected to mirror input 10. The drain of transistor T1 is connected to its gate via line 12. The gate of transistor T1 is connected to the gate of transistor T2 via line 14. The drain of transistor T2 is connected to mirror output 16. Since the gate of transistor T2 is connected to the gate of transistor T1, the current through transistor T2 and output at mirror output 16 will be equal to or "mirror" the current through transistor T1 and input at mirror input 10 if transistors T1 and T2 are identical.

More specifically, the drain current for a FET—both gallium arsenide and silicon—may be approximated by the following equations:

$$I_D = k(V_{GS} - V_T)^2(1 + \lambda V_{DS}) \text{ for } V_{DS} \geq V_{GS} - V_T$$
$$= k V_{DS}[2(V_{GS} - V_T) - V_{DS}](1 + \lambda V_{DS}) \text{ for }$$
$$V_{DS} \leq V_{GS} - V_T$$

where:
- $I_D$ is the drain current;
- $k$ is the current gain factor, which is proportional to the width of the transistor;
- $V_{GS}$ is the gate-source voltage;
- $V_T$ is the threshold voltage;
- $V_{DS}$ is the drain-source voltage; and
- $\lambda$ is the channel length modulation parameter.

In FIG. 1, the current flowing through the drain of transistor T1 will be the circuit's input current, $I_{in}$. If we assume that $\lambda$ is small, then the gate to source voltage $V_{GS}$ of transistor T1 is $(I_{in}/k_1)^{\frac{1}{2}} + V_T$, where $k_1$ is the current gain factor for transistor T1. The gate to source voltage of transistor T2 is the same as for transistor T1. Thus, $V_{GS}$ of transistor T2 will be $(k_2/k_1)I_{in}$, which is equal to the output current $I_{out}$. This equation gives the basic principle behind most existing current mirrors and amplifiers. Unfortunately, this current mirroring technique will not work for depletion-mode FET technology, because it assumes that transistor T2 is in the saturation mode (e.g. $V_{DS} > V_{GS} - V_T$) when the gate of transistor T1 is connected to its drain. This not true for depletion-mode technology, where the threshold voltage $V_T$ is negative.

FIG. 2 depicts a so-called "Wilson" current mirror that is more precise than the typical current mirror depicted in FIG. 1. In the Wilson approach, an additional FET T3 is connected to the mirror output 16. The gate of transistor T3 is connected to mirror input 10 via line 20. The drain of transistor T2 is connected to its gate via line 18. The purpose of transistor T3 is to increase the linearity of the current mirror output by increasing the mirror's output impedance. However, the Wilson current mirror depicted in FIG. 2 still may not be used with depletion-mode FET devices for the reasons discussed above.

SUMMARY OF THE INVENTION

It is a feature of the present invention to provide a precise current mirror that may use only depletion-mode field effect transistors and Schottky diodes.

It is another feature of the present invention to provide a current mirror building-block to enable complex analog monolithic depletion-mode gallium arsenide circuits to be designed.

These and other features are accomplished in a novel, precise current mirroring technique for depletion-mode field effect technology. A diode level-shifting circuit employing Schottky diodes and a transistor is used to maintain a first depletion-mode FET in its active or linear mode. In one embodiment, the level-shifting circuit is connected between the drain and the gate of a first FET, forcing its gate voltage to be lower than its drain voltage for alternating current signals, while at the same time keeping the transistor at its direct current (dc) saturation point. The gate of the first depletion-mode FET is connected to the gate of a second depletion-mode FET. The level-shifting circuit draws current and thus reduces the current available at the mirror's output. To solve this problem, a current compensation source is used to compensate for the current drawn by the level-shifting circuit by adding current that is proportional to the drawn current so that the output current of the current mirror is equal to a fixed multiple of the input current. The ratio between the current provided by the current compensation source and the current drawn by the level-shifting circuit is equal to the ratio between the output current and the input current. The current source preferably includes a FET and at least one Schottky diode.

In another embodiment, the level-shifting circuit is connected between the drain and the gate of the second depletion-mode FET. The drain and the gate of the second depletion-mode FET are connected in circuit to the drain and the gate respectively of the first depletion-mode FET such that the drain voltage and the gate voltage of the second FET are reflected to the first FET. Another FET, whose gate is connected to the mirror's input, is also connected to the mirror's output to increase the output impedance and the linearity of the current mirror.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
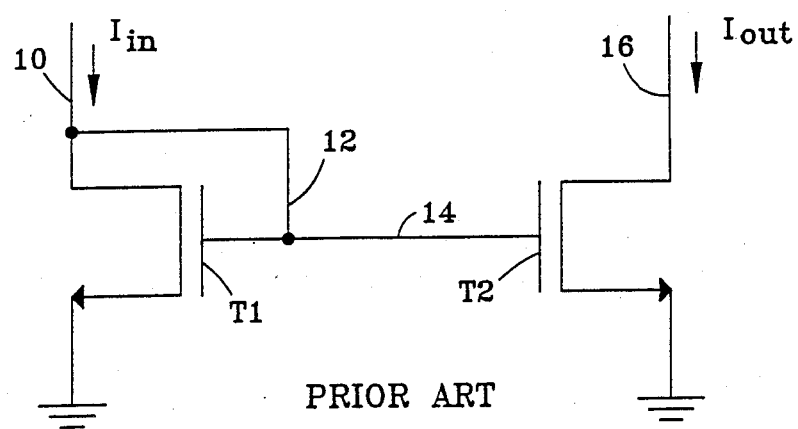
FIG. 1 is a typical prior art current mirror using enhancement-mode transistors.
Figure 2:
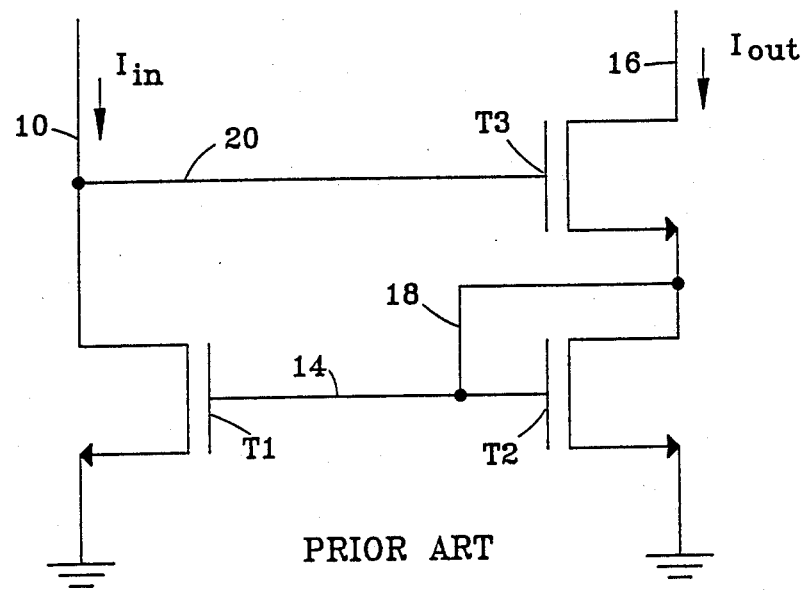
FIG. 2 is a schematic of a prior art "Wilson" current mirror employing enhancement-mode transistors.
Figure 3:
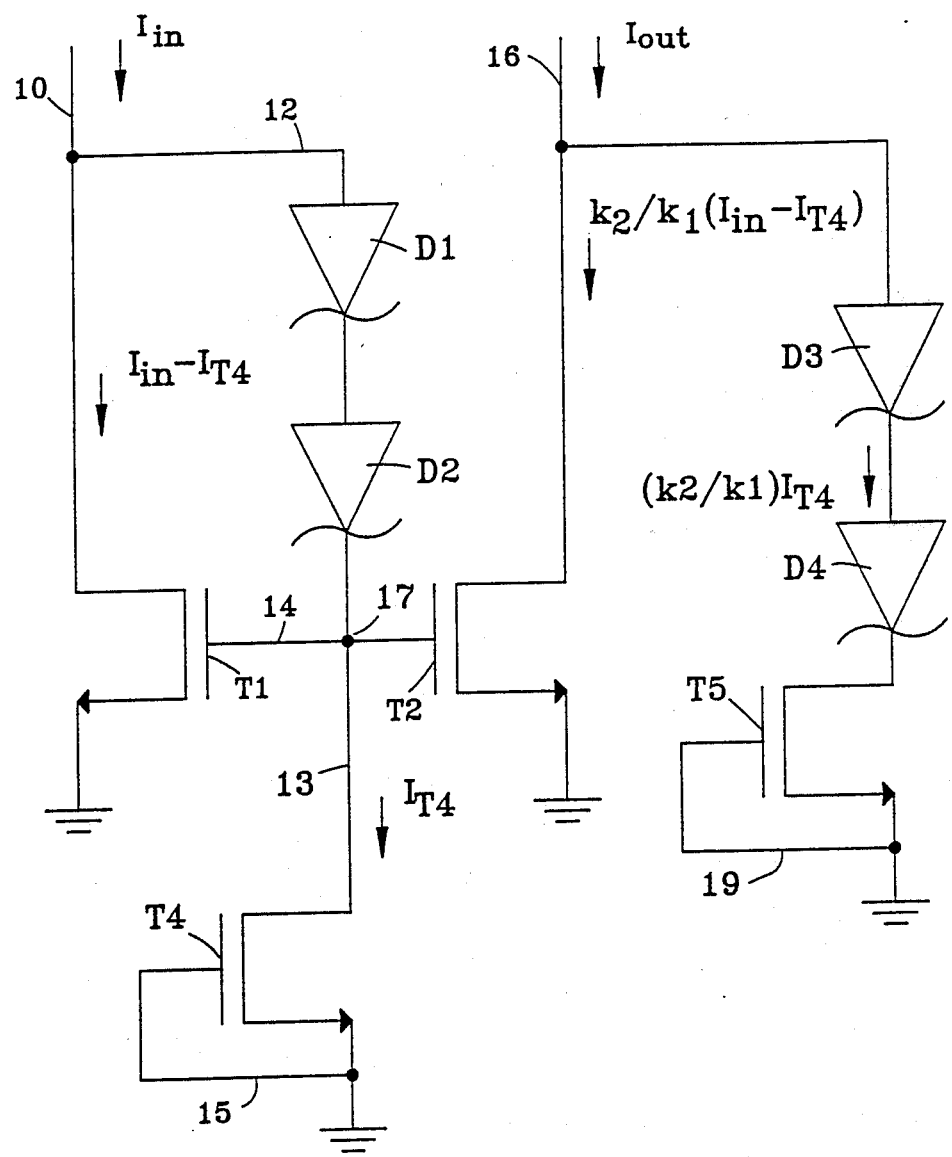
FIG. 3 is an improved depletion-mode FET current mirror according to the present invention.

FIG. 3 depicts a current mirror according to the present invention. In FIG. 3 depletion-mode Field Effect Transistors (FETs) T1, T2 and T4 are used along with two Schottky diodes D1 and D2. Transistors T1 and T2 in FIG. 3 are comparable to transistors T1 and T2 in FIGS. 1 and 2 except that transistors T1 and T2 in FIG. 3 are depletion-mode field effect transistors. The input current $I_{in}$ enters the current mirror at input 10. The drain of transistor T1 is connected to input 10, and its source is connected to a power supply, which could be ground. The drain of transistor T1 is connected to its gate via line 12, Schottky diodes D1 and D2, and line 17. Transistor T4 has its drain connected to Schottky diode D2 via line 13. Transistor T4 has its gate connected to its source via line 15. Transistor T4 controls the current flow through diodes D1 and D2. The gate of transistor T1 is connected to the gate of transistor T2 via line 14. The drain of transistor T2 is connected to the current mirror output 16.

Level-shifting diodes D1 and D2 force transistor T1 to remain in its saturation mode. However, transistor T2 is not forced to remain in its saturation mode. Transistor T2 is allowed to enter its non-saturated mode when the voltage fluctuations at the mirror's output are unusually high.

A small portion of the input current, approximately equalling $I_{T4}$, passes through transistor T4, but a much larger portion corresponding to $I_{in}-I_{T4}$ passes through transistor T1. The gate currents for transistors T1 and T2 are so small that they may be ignored.

The gate voltage of transistor T1 is level-shifted two diode drops below its drain voltage by Schottky diodes D1 and D2 and transistor T4. Diodes D1 and D2 along with transistor T4 act essentially like a battery. The voltage at point 17 is equal to the gate voltage $V_G$ of transistor T1, so that most of the input current $I_{in}$ passes through transistor T1. Connecting the voltage at point 17 to the gate of transistor T2 via line 14 makes the output current $I_{out}$ equal to the current through transistor T1 if transistors T1 and T2 are identical devices. If transistors T1 and T2 are not identical, then the ratio of $I_{in}$ to $I_{out}$ is equal to the ratio of the dimensions of the gates of the two transistors T1 and T2. In other words, $$I_{out}=k_2/k_1\,(I_{in}),$$

where
  $k_n$=the width, $w_n$, of the gate divided by the length, $l_n$, of the gate for the transistor Tn; and
  $I_{Tn}$=the current passing through transistor Tn.

The circuit depicted in FIG. 3 includes a current source to compensate for the current drawn by the level-shifting circuit away from transistor T1. The current source is comprised of Schottky diodes D3 and D4 and a depletion-mode FET T5, whose gate is connected to its source via line 19. Diodes D3 and D4 are used to mimic the series resistance of diodes D1 and D2 to yield a more predictable response for the current mirror. The current source is connected to a current mirror output 16 to provide current to the output. Although the current source depicted in FIG. 3 is comprised Schottky diodes and a FET transistor, any other suitable current source may be used to provide the requisite compensating current. Thus, any silicon or gallium arsenide enhancement or depletion-mode transistors could be used in place of transistor T5 to comprise the current source, with or without diodes. The current source could be a single transistor whose drain is tied to the current mirror output 16. If more than one Schottky diode is used, the values of the diodes would be approximately equal to each other. The ultimate number of diodes to be used in the current sources in FIG. 3 is determined by the threshold voltage $V_T$ of transistor T5. The more negative the threshold voltage, the more diodes that should be used.

The addition of curent by the current source proportional to $I_{T4}$ compensates for the current drawn through transistor T4 and enables the output current $I_{out}$ at output 16 to be equal to the input current $I_{in}$ at input 10 as long as the value of $k_2$ for transistor T2 equals the value $k_1$ of transistor T1.

In FIG. 3, the current source comprising Schottky diodes D3 and D4 and transistor T5 compensates for the current drawn by diodes D1 and D2 if $k_2/k_1 = k_5/k_4$.

The equality of these two ratios of the transistors' respective gate dimensions indicates that the input current is mirrored without the introduction of any error term.

Assuming the above equation ismet, then:

$I_{out} = (k_2/k_1) I_{in}$.

The amount of current provided by the current source is proportional to and compensates for the current drawn by the level-shifting circuit comprising diodes D1 and D2 and transistor T4. Also, the ratio between the current provided by the current source and the current drawn by the level-shifting circuit is proportional to the ratio between the output current $I_{out}$ and the input current $I_{in}$.

Figure 4:
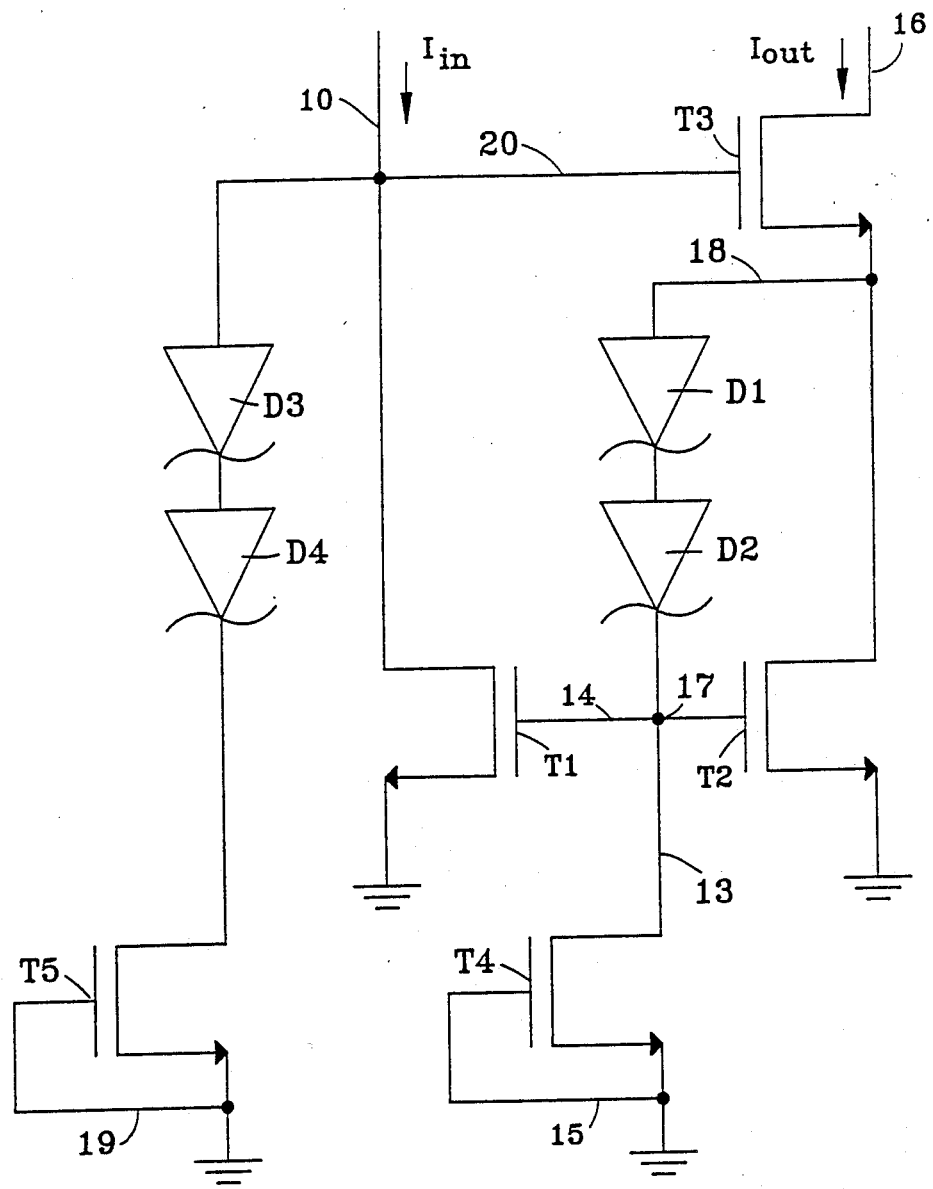
FIG. 4 is another embodiment of the improved depletion-mode FET current mirror according to the present invention.

FIG. 4 is another embodiment of the present invention. In FIG. 4 a "Wilson" current mirror is provided with level-shifting and current compensation circuits as discussed above in connection with FIG. 3, and also with a transistor T3 whose drain is connected to the current mirror output 16. The gate of transistor T3 is connected via line 20 to the current mirror input 10. The source of transistor T3 is connected to the drain of transistor T2 as depicted in FIG. 4. FIG. 4 is otherwise identical to FIG. 3, except that the level-shifting circuit is connected via line 18 to the drain of the transistor T2 instead of to the drain of transistor T1 as depicted in FIG. 3. Also, the current source in FIG. 4 comprising diodes D3 and D4 and transistor T5 provides current on the input side of the current mirror as opposed to the output side as depicted in FIG. 3.

Although the level-shifting circuit is connected between the drain and gate of transistor T2 to maintain transistor T2 in its saturated mode, the level-shifting circuit also maintains transistor T1 in its saturated mode. The drain voltage and the gate voltage of transistor T2 are reflected so that the drain voltage of transistor T1 approximately equals the drain voltage of transistor T2, and the gate voltage of transistor T1 equals the gate voltage of transistor T2.

Referring to FIG. 4, this reflection is achieved as follows. For simplicity, assume that transistor T1 is the same as transistor T2, so that $k_1 = k_2$. Transistor T1 is chosen so that at a specified nominal dc current level its gate to source volage $V_{GS1}$ equals zero. Since transistor T1 is the same as transistor T2, the gate to source voltage $V_{GS2}$ of transistor T2 also equals zero.

Next, transistor T3 is selected so that it is also the same as transistor T1. Thus, the gate to source voltage $V_{GS3}$ of transistor T3 also equals zero.

As shown in FIG. 4, the gates of transistors T1 and T2 are tied together so that their respective gate voltages, $V_{G1}$ and $V_{G2}$, are equal.

Since transistors T1 and T2 are the same, $V_{G3} = V_{D1}$ and $V_{S3} = V_{D2} = V_{G3}$.

Therefore, $V_{D1} = V_{D2}$.

The gate voltage of transistor T2 is level-shifted two diode drops below its drain voltage $V_{D2}$ by diodes D1 and D2. Therefore, the gate voltage $V_{G1}$ of transistor T1 is also level-shifted two diode drops below its drain voltage $V_{D1}$ so that transistor T1 is maintained in its saturated mode by the reflected drain and gate voltages of transistor T2.

As in FIG. 3, the current compensation circuit of FIG. 4 adds current that is proportional to the current drawn by the level-shifting diode circuit. The current drawn by the level-shifting diode circuit effectively reduces the current available for output by output 16.

In FIG. 4 the current source comprising Schottky diodes D3 and D4 and transistor T5 compensates for the current drawn by diodes D1 and D2 if $k_2/k_1 = k_4/k_5$.

Assuming the above equation is met, then $I_{out} = (k_2/k_1) I_{in}$.

This latter equation is the transfer function of an ideal current mirror. Of course, if transistors T1 and T2 are identical, then $I_{out}$ is equal to $I_{in}$.

The improved current mirror in FIG. 4 has a higher output impedance than the current mirror depicted in FIG. 3. The higher output impedance is due to the addition of transistor T3, which increases the linearity of the current output of the current mirror by making it less susceptible to fluctuation caused by varying voltages present at mirror output 16. Transistor T3 may be any type of field effect transistor.

Figure 5:
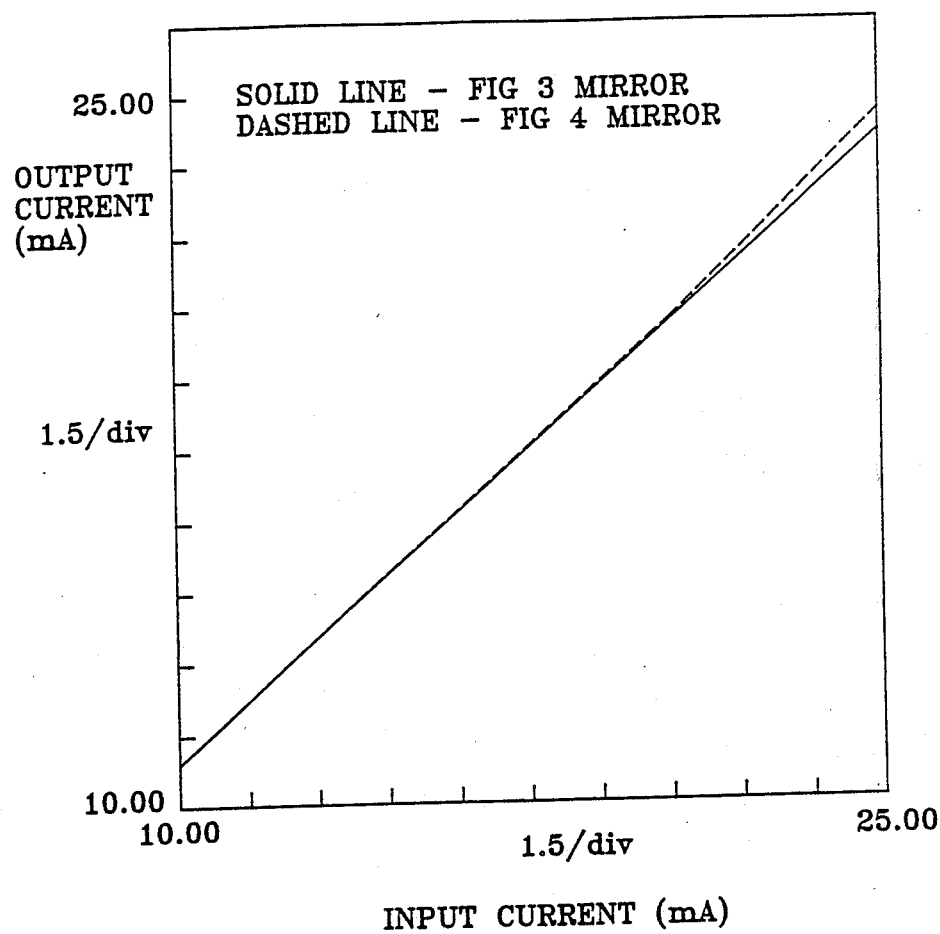
FIG. 5 is a combined graph of test results of the input current $I_{in}$ versus the output current $I_{out}$ for the circuits depicted in FIG. 3 and FIG. 4.

Tests have been run on the improved current mirror depicted in FIGS. 3 and 4. FIG. 5 is a combined graph depicting tests results of the input current $I_{in}$ versus the output current $I_{out}$ for the circuits depicted in FIGS. 3 and 4. The solid line represents the circuit in FIG. 3; the dashed line represents the circuit in FIG. 4. Although both curves are essentially linear, FIG. 5 shows that the current mirror of FIG. 4 is a more accurate circuit than the one depicted in FIG. 3.

While particular embodiments of the invention have been shown and described, numerous modifications and alternate embodiments will occur to those skilled in the art. Accordingly, it is intended that the invention be limited only by the following claims:

I claim:

1. A current mirror, comprising:
   input circuit means for accepting input current;
   a first depletion-mode field effect transistor (FET) connected in circuit with the input circuit means;
   a second depletion-mode FET whose gate is connected in circuit and the gate of the first FET;
   an output circuit means connected in circuit with the second FET for outputting current which mirrors the input current;
   a level-shifting circuit that maintains the first depletion-mode FEt in its active or linear mode, said level-shifting circuit also drawing current wherein the level-shifting circuit is connected in circuit with both the drain and the gate of the second FET to maintain the gate voltage of the second FET below its drain voltage, and wherein the drain and the gate of the second FET are connected in circuit with the drain and the gate respectively of the first FET such that the drain voltage and the gate voltage of the second FET are reflected to equal the drain voltage and the gate voltage respectively of the first FET; and a current compensation circuit that provides current that is proportional to the current drawn by the level-shifting circuit.

2. The current mirror of claim 1, further comprising:
a third transistor connected in circuit with both the second FET and the output circuit means and whose gate is connected in circuit with the input circuit means.

3. A current mirror, comprising:
input circuit means for accepting input current;
a first depletion-mode field effect transistor (FET) connected in circuit with the input circuit means;
a level-shifting circuit connected in circuit with both the drain and the gate of the first FET that maintains the gate voltage of the first FET below its drain voltage, said level-shifting circuit also drawing current from the input circuit means away from the first FET, said level-shifting circuit including at least one diode and a third transistor connected in circuit with said diode;
a second depletion-mode FET whose gate is connected in circuit with the gate of the first FET;
an output circuit means connected in circuit with the second FET for outputting current which mirrors the input current; and
a current compensation circuit connected in circuit with the output circuit means and providing current thereto that is proportional to the current drawn from the input circuit means by the level-shifting circuit.

4. The current mirror of claim 3, wherein said current compensation circuit includes:
at least one Schottky diode; and
a third transistor connected in circuit with said Schottky diode.

5. A current mirror, comprising:
input circuit means for accepting input current;
a first depletion-mode field effect transistor (FET) connected in circuit with the input circuit means;
at least one first diode connected between the gate and the drain of the first FET and drawing current from said input circuit means away from the first FET;
an output circuit means for outputting current which mirrors the input current;
a second depletion-mode FET connected to the output circuit means, the gate of said second FET being connected in circuit with the gate of said first FET;
a current source comprising at least one Schottky diode; and
a third transistor connected in circuit with said Schottky diode.

6. The current mirror of claim 5, further comprising:
a third transistor connected in circuit with said first diode.

7. The current mirror of claim 5, wherein the ratio between the current provided by the current source and the current drawn by the first diode is the same as the ratio between the output current and the input current.

8. A current mirror, comprising:
input circuit means for accepting input current;
a first depletion-mode field effect transistor (FET) connected in circuit with the input circuit means;
a second depletion-mode FET whose gate is connected in circuit with the gate of the first FET;
an output circuit means connected in circuit with said second FET for outputting current which mirrors the input current;
a level-shifting circuit connected in circuit with both the drain and the gate of the second FET that maintains the gate voltage of the second FEt below its drain voltage, said level-shifting circuit also drawing current from the output circuit means;
a current compensation circuit connected in circuit with the first FET and providing current thereto that is proportional to the current drawn from the output circuit means by the level-shifting circuit; and
a third transistor connected in circuit with both the second FET and the output circuit means and whose gate is connected in circuit with the input circuit means.

9. The current mirror of claim 8, wherein said level-shifting circuit includes:
at least one diode; and
a fourth transistor connected in circuit with said diode.

10. The current mirror of claim 8, wherein said current compensation circuit includes:
at least one Schottky diode; and
a fourth transistor connected in circuit with said Schottky diode.

11. A current mirror, comprising:
input circuit means for accepting input current;
a first depletion-mode field effect transistor (FET) connected in circuit with the input circuit means;
a second depletion-mode FET whose gate is connected in circuit with the gate of the first FET;
an output circuit means connected in circuit with the second FET for outputting current which mirrors the input current;
at least one first diode connected between the gate and the drain of the second FET and drawing current from the output circuit means;
a current source connected in circuit with the first FET and providing current thereto that is proportional to the current drawn from the output circuit means by the first diode; and
a third transistor connected in circuit with both the second FET and the output circuit means and whose gate is connected in circuit with the input circuit means.

12. The current mirror of claim 11, further comprising:
a fourth transistor connected in circuit with the first diode.

13. The current mirror of claim 16, wherein said current source includes:
at least one Schottky diode; and
a fourth transistor connected in circuit with said Schottky diode.

* * * * *

UNITED STATES PATENT AND TRADEMARK OFFICE
CERTIFICATE OF CORRECTION

PATENT NO. : 4,896,121

DATED : JANUARY 23, 1990

INVENTOR(S) : LAWRENCE LARSON

It is certified that error appears in the above-identified patent and that said Letters Patent is hereby corrected as shown below:

Col. 6, line 57, delete "FEt" and insert --FET--.

Col. 8, line 11, delete "FEt" and insert --FET--.

Signed and Sealed this

Nineteenth Day of October, 1993

Attest:

BRUCE LEHMAN

Attesting Officer    Commissioner of Patents and Trademarks